United States Patent
Stein et al.

(10) Patent No.: US 7,408,495 B2
(45) Date of Patent: Aug. 5, 2008

(54) DIGITAL EQUALIZATION OF MULTIPLE INTERLEAVED ANALOG-TO-DIGITAL CONVERTERS

(75) Inventors: Anatoli Stein, Atherton, CA (US); Semen P. Volfbeyn, Milpitas, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 11/493,353

(22) Filed: Jul. 25, 2006

(65) Prior Publication Data

US 2007/0262895 A1    Nov. 15, 2007

Related U.S. Application Data

(60) Provisional application No. 60/800,624, filed on May 15, 2006.

(51) Int. Cl.
*H03M 1/12* (2006.01)
(52) U.S. Cl. .................. 341/155; 341/120
(58) Field of Classification Search .......... 341/155, 341/118, 122, 141, 120
See application file for complete search history.

(56) References Cited

U.S. PATENT DOCUMENTS

| | | | |
|---|---|---|---|
| 4,884,265 A | 11/1989 | Schroeder et al. | |
| 5,239,299 A | 8/1993 | Apple et al. | 341/118 |
| 6,353,629 B1 * | 3/2002 | Pal | 375/222 |
| 6,653,959 B1 | 11/2003 | Song | 341/131 |
| 6,707,255 B2 * | 3/2004 | Coumou et al. | 315/111.41 |
| 7,049,984 B2 * | 5/2006 | Wood et al. | 341/120 |
| 7,227,479 B1 * | 6/2007 | Chen et al. | 341/118 |
| 7,233,270 B2 * | 6/2007 | Lin | 341/118 |
| 2004/0002652 A1 | 1/2004 | Phelps et al. | |
| 2004/0174284 A1 | 9/2004 | Pupalaikis | |
| 2005/0219091 A1 | 10/2005 | Wood et al. | 341/120 |
| 2006/0239389 A1 * | 10/2006 | Coumou | 375/346 |

* cited by examiner

*Primary Examiner*—Peguy JeanPierre
(74) *Attorney, Agent, or Firm*—Van Pelt, Yi & James LLP

(57) ABSTRACT

Time variant interleaving equalization of an interleaved analog to digital converter is disclosed. A high-frequency analog input signal is converted into a plurality of individual digital signals using a plurality of interleaved analog-to-digital converters. the plurality of individual digital signals are interleaved into a composite digital signal. The composite digital signal is processed in a time variant interleaving equalizer using a plurality of sets of equalizer coefficients.

13 Claims, 6 Drawing Sheets

DIGITAL EQUALIZATION OF MULTIPLE INTERLEAVED ANALOG-TO-DIGITAL CONVERTERS

CROSS REFERENCE TO OTHER APPLICATIONS

This application claims priority to U.S. Provisional Patent Application No. 60/800,624 entitled DIGITAL EQUALIZATION OF MULTIPLE INTERLEAVED ANALOG-TO-DIGITAL CONVERTERS filed May 15, 2006 which is incorporated herein by reference for all purposes.

BACKGROUND OF THE INVENTION

Multiple interleaved Analog-to-Digital (ADC) converters are widely used to increase the sampling rate of the conversion. In order to adjust the multiple ADC's so that they perform equivalently, a typical commercially available high-speed ADC has build-in adjustable controls for the DC offset, gain, and clock timing. In addition to the DC offset, gain, and clock timing differences between ADC's, the amplitude frequency response and the group delay frequency response of ADC's are also not identical. These differences might arise from differences in the frequency responses of the analog signal distributing circuitry or the analog front end of an ADC (e.g., input amplifier, track-and-hold circuit, etc.), which are difficult to eliminate given current design practices and process technology variations. It is therefore necessary to equalize the response characteristics of the different ADC's. One equalization strategy is to digitally equalize after each ADC. However, equalizing each ADC separately limits the bandwidth over which the equalization can be done; especially since an individual ADC is only 1/N of the overall bandwidth desired given N ADC's in a system. Another equalization strategy is to digitally equalize after the ADC streams have been combined. However, at this point the different ADC frequency responses and group delays are intermingled and cannot be removed by a simple equalizer. In addition, in some cases, the equalizer uses FFT transforms in order to equalize in the frequency domain, and significant computation delay and complexity is introduced into the signal processing. It would be beneficial to be able to equalize the interleaved digitizer samples at full bandwidth without suffering from the intermingled ADC responses.

BRIEF DESCRIPTION OF THE DRAWINGS

Various embodiments of the invention are disclosed in the following detailed description and the accompanying drawings.

DETAILED DESCRIPTION

Figure 1:
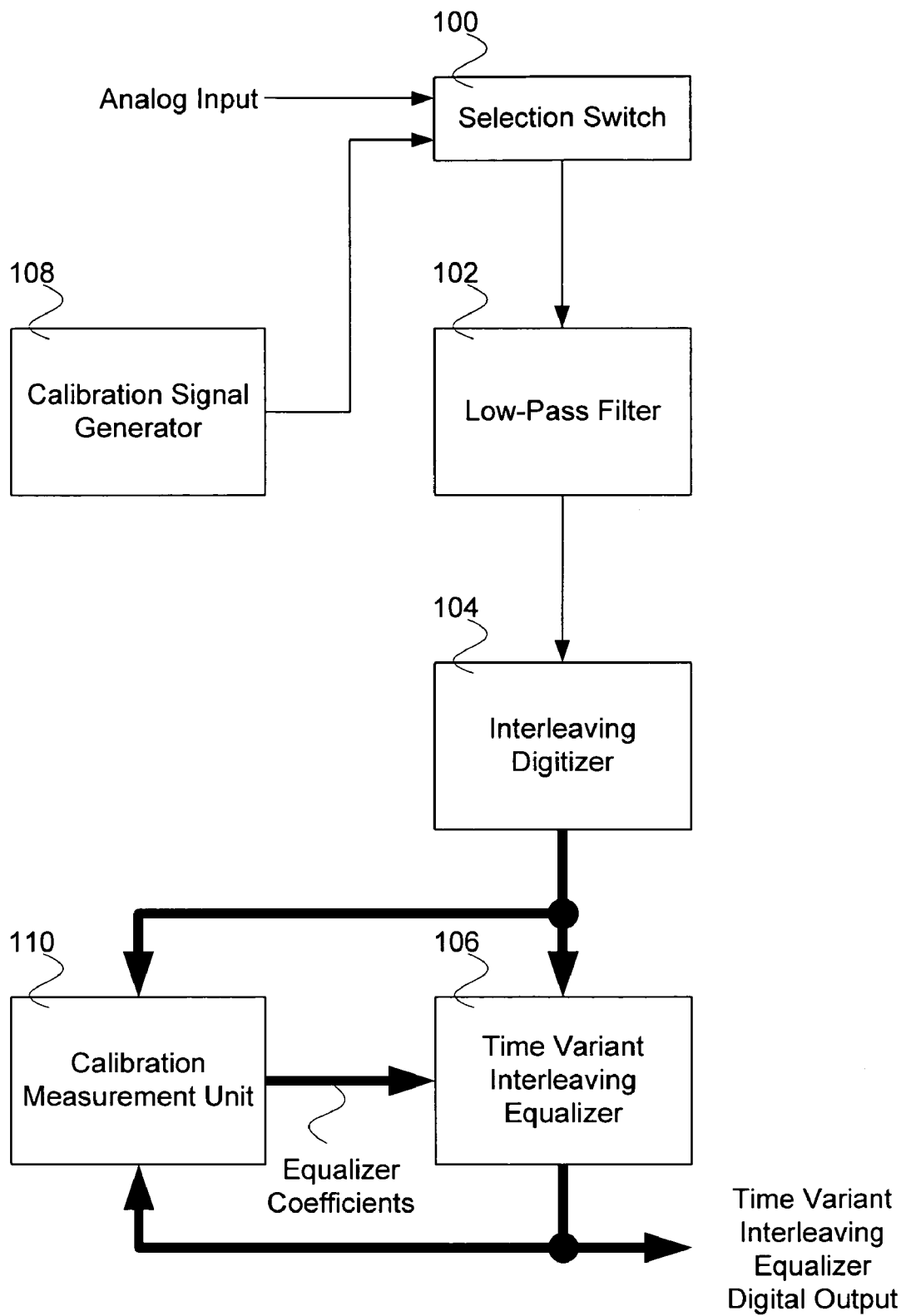
FIG. 1 is a block diagram illustrating an embodiment of a system for equalizing samples from interleaved digitizers.

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Equalizing samples from interleaved digitizers is disclosed. Samples are received from a plurality of interleaved digitizers. A subset of the samples is selected. The first sample of the subset of samples is associated with a selected digitizer of the plurality of interleaved digitizers. A weighted subset of samples is calculated by multiplying each of the subset of samples with one of a selected set of equalizer coefficients. The selected set of equalizer coefficients is associated with the selected digitizer of the plurality of interleaved digitizers associated with the first sample of the subset of samples. An equalized output sample is calculated by summing the weighted subset of samples.

In some embodiments, a higher effective sampling frequency is made possible by using a number of digitizers (i.e. analog to digital converters) sampling at a lower frequency, but interleaved and offset in phase from each other. For example, N digitizers sample an input signal at a frequency $f_s$, but where the $i^{th}$ digitizer samples at a different phase $(i-1)$ *360°/N—so for 4 digitizers, the phases would be 0, 90°, 180°, and 270°. The samples are interleaved from the digitizers to create a sample stream of data. Filtering, or equalizing, of the data is performed in order to correct for differences in DC offset, gain, clock timing, amplitude frequency response, group delay frequency response, or any other appropriate difference in channel characteristics between the digitizers.

In various embodiments, the filter, or equalizer, comprises a digital filter, a finite impulse response (FIR) filter, an infinite impulse response (IIR) filter, or any other appropriate filter. In some embodiments, a subset of the input, or received samples, are multiplied by coefficients to equalize the input samples. In some embodiments, a different set of equalizing filter coefficients is used to equalize the input samples and there are different sets of equalizing filter coefficients depending on which samples of the input sample stream are being processed. In some embodiments, there are as many sets of equalizing filter coefficients as there are digitizers. In some embodiments, the sets of equalizing filter coefficients are used in the same order as the digitized samples from the plurality of digitizers are interleaved. For example, samples from digitizer are interleaved as sample from digitizer a, sample from digitizer b, sample from digitizer c, sample from digitizer d, sample from digitizer a, sample from digitizer b, sample from digitizer c, etc. and similarly the sets of equalizing filter coefficients that are used for calculating the equalized stream are set 0, set 1, set 2, set 3, set 0, set 1, set 2, etc.

In some embodiments, time variant interleaving equalization of interleaved analog to digital converters includes converting a high-frequency analog input signal into a plurality of individual digital signals using a plurality of interleaved analog-to-digital converters, interleaving the plurality of individual digital signals into a composite digital signal, and processing the composite digital signal in a time variant interleaving equalizer using a plurality of sets of equalizer coefficients. The time variant interleaving equalizer is synchronized with the interleaving of the plurality of individual digital signals into the composite digital signal. During any sampling interval, when a certain sample of the composite digital signal is present at the time variant equalizer input, the synchronization of the time variant equalizer assures the identification of the individual digital signal that contained said sample before interleaving. The synchronization of the time variant equalizer assures, during said sampling interval, the use of the set of equalizer coefficients that corresponds to the identified individual digital signal. The sets of equalizer coefficients are prepared before the operation of the multiple interleaved analog to digital converter by using a calibration procedure.

In some embodiments, calibration includes measuring a comparative amplitude and group delay frequency response of all individual digital signals and calculating the sets of equalizer coefficients using the measured comparative amplitude and group delay frequency responses. The measurement of the comparative amplitude and group delay frequency responses includes generating a sinusoidal analog input signal and feeding it to the input of the multiple interleaved analog to digital converter, selecting a subset of samples that belong to a certain individual digital signal from the set of samples of the composite digital signal, measuring the amplitude and group delay of the selected subset of samples in relation to a reference signal, repeating previous steps for each of the individual digital signals, and repeating previous steps for different frequencies of the sinusoidal analog input signal, these frequencies covering the entire bandwidth of the multiple interleaved analog to digital converter. In various embodiments, one of the individual digital signals is used as the reference signal or an imported amplitude and group delay frequency response is used as the reference. To enhance the accuracy of the equalizer coefficients computation, the calibration procedure is repeated with the subset of samples that are chosen from the samples of the digital signal at the time variant equalizer output. In some cases, the enhancement of the accuracy of the measurement of the comparative amplitude and group delay frequency responses is achieved by using averaging technology wherein a ratio of a calibration frequency signal to a clock signal for the interleaved digitizer differs from an integer by a small deviation.

In some embodiments, a multiple interleaved analog to digital converter with digital equalization includes: a calibration signal generator having an output, wherein the calibration signal generator is capable of outputting a sinusoidal signal; a selection switch, having two signal inputs and an output, wherein the first signal input is connected to a signal that is to processed by the multiple interleaved analog to digital converter, the second signal input is connected to the output of the calibration signal generator; an anti-aliasing low-pass filter with an input and an output, wherein the input is connected to the output of the selection switch; an interleaving digitizer, having an analog input and a digital output, wherein the analog input is connected to the output of the anti-aliasing low-pass filter; a time variant equalizer, having a signal input, an equalizer coefficients input and an output, wherein the signal input is connected to the digital output of the interleaving digitizer and the output is used as an output of the multiple interleaved analog to digital converter; and a calibration measurement unit, having two inputs and an output, wherein the first input is connected to the digital output of the interleaving digitizer, the second input is connected to the output of the time variant equalizer, and the output of the calibration measurement unit is connected to the equalizer coefficients input of the time variant equalizer. In some cases, the selection switch switches between the first signal input or second signal input depending on whether the digital converter is in an operation mode or in a calibration mode.

In some embodiments, the time variant equalizer includes a delay register with a signal input, a clock input and N outputs, wherein N is a predetermined equalizer length and the signal input of the delay register is used as the time variant equalizer input; a set of N multipliers, each multiplier having two inputs and an output, wherein the first input of every multiplier is connected to the corresponding output of the delay register and the second input of every multiplier is connected to an equalizer coefficients bus; an adder with N signal inputs, a clock input and an output, wherein each of the signal inputs is connected to the output of the correspondent multiplier and the output is used as an output of the time variant equalizer; a coefficient memory with synchronization, having an input and an output equalizer coefficient bus, wherein the input is used as an equalizer coefficient input of the time variant equalizer, and the output equalizer coefficients bus feeds the each of the second inputs of each of the N multipliers; and a coefficients bus that connects the output of the coefficient memory with synchronization to each of the second inputs of the N multipliers. The coefficients memory includes synchronization during any sampling interval, wherein when a certain sample of the composite digital signal is present at the time variant equalizer input, the coefficient memory distributes to the equalizer coefficients bus the set of equalizer coefficients corresponding to the individual digital signal that contained said sample before interleaving.

In some embodiments, the calibration measurement unit includes a switch with two inputs and an output, wherein the first input is used as the first input of the calibration measurement unit and the second input is used as the second input of the calibration measurement unit; a control unit with an output; a subset selector, having a signal input, a control input and an output, wherein the signal input is connected to the output of the switch, and the control input is connected to the output of the control unit; a response memory, having a measurement results input, a control input, and an output, wherein the measurement results input is connected to the output of the amplitude and phase shift measurer, and the control input is connected to the output of the control unit; and an equalizer coefficients calculator, having a response input, a control input and an output, wherein the response input is connected to the output of the response memory, the control input is connected to the output of the control unit, and the output is used as the output of the calibration measurement unit.

FIG. 1 is a block diagram illustrating an embodiment of a system for equalizing samples from interleaved digitizers. In the example shown, an analog input signal is input to selection switch 100. Selection switch 100 also has as input the output of calibration signal generator 108. Selection switch 100 selects which input signal to pass to low-pass filter 102. Low-pass filter 102 is designed to remove high-frequency content from the input signal that could distort the subsequent digitized signal(s) through aliasing (i.e., an anti-aliasing filter). In various embodiments, low-pass filter 102 comprises an analog filter, a Butterworth filter, Chebyshev filter, Bessel filter, a filter with a cutoff frequency satisfying the Nyquist sampling criteria for a digitizer, or any other appropriate low-pass filter. In some embodiments, selection switch 100 is placed after low-pass filter 102. Low-pass filter 102 outputs its signal to interleaving digitizer 104.

Interleaving digitizer 104 samples its input signal using a plurality of digitizers sampling at a common frequency, where each digitizer is sampling at a different time due to a phase shift between the sample clocks of each of the digitizers. For example, interleaving digitizer 104 comprises three analog-to-digital converters (ADC's) sampling at a frequency $f_s$ with relative phases of the sampling clocks of 0°, 120°, and 240°. In some embodiments, the sampling clocks are not equi-spaced in phase. The samples from the plurality of digitizers are interleaved—for example, for the three ADC's in the example above, the output samples are interleaved in the order that the samples were digitized and output at three times the individual digitizer sampling frequency ($3 \times f_s$). The output samples of interleaving digitizer 104 are sent to both calibration measurement unit 110 and interleaving equalizer 106.

Calibration measurement unit 110 can achieve a more accurate measurement of the response errors (e.g., amplitude frequency response and group delay frequency response) by averaging. If each frequency of the test-signal generator is chosen in such a way that it is not an integer multiple of the ADC clock frequency, then sampled points can be accumulated and averaged to better measure the shape of the digitized test signal. In some embodiments, the test generator frequency is chosen with different phase offsets, or a slowly drifting phase offset, to a reference enabling the sampling of the test waveform at different offsets—a waveform can be built up using different phase offset measurements. In some embodiments, the calibration unit measures the amplitude and phase frequency responses of a subset of the digitized samples (e.g., only samples from a given individual digitizer) and the equalizer coefficients for that individual digitizer are calculated. In some embodiments, one of the digitizer's amplitude and phase frequency response is used as a reference. In some embodiments, the amplitude and phase frequency response characteristics are similar between the different digitizers and therefore the equalizing coefficients are similar to a first order but not to a second order of correction.

Interleaving equalizer 106 equalizes the interleaved samples from interleaving digitizer 104. Interleaving equalizer 106 filters the interleaved samples with multiple sets of filter coefficients. The sets of filter coefficients are determined such that their use in filtering the interleaved samples corrects for distortions in the digitizing signal path (e.g., filters, amplifiers, converters, path mismatch, etc.). The interleaving of the samples may create a different distortion characteristic associated with a sample from a given digitizer, this can be corrected using multiple sets of filter coefficients for the equalizer. For example, if there are four digitizers (e.g., a, b, c, and d) producing an output sequence $X_i$ (e.g., the source of the outputs is the interleaved digitizers $X_0$ from digitizer a, $X_1$ from digitizer b, $X_2$ from digitizer c, $X_3$ from digitizer d, $X_4$ from digitizer a, etc.), then the equalizing filter should account for the different distortion characteristics due to the different interleaved sequences. If there is a five-tap equalizing filter, then the samples from the four digitizers multiplying the five taps can be in the following four configurations: a-b-c-d-a, b-c-d-a-b, c-d-a-b-c, and d-a-b-c-d. So, using four sets of equalizing filter taps, corresponding the four configurations, equalization filtering can be performed to reduce the distortions of the interleaved digitizers. According to this example, the number of sets of filter coefficients equals the number of digitizers. In various embodiments, the number of digitizers is any integer number of digitizers, and the number of taps in the equalizing filter is any integer number of taps. In some embodiments, the number of sets of filter coefficients does not equal the number of digitizers; non-linear corrections may require more sets of filter coefficients and, in some cases, redundant sets of coefficients may perform adequate equalization.

Calibration measurement unit 110 can be used to determine the sets of filter coefficients. Calibration signal generator 108 can be used to input a signal with known amplitude and frequency characteristics by appropriately setting selection switch 100. This signal is processed and ultimately digitized by interleaving digitizer 104. Calibration measurement unit 110 compares input interleaved digitized samples with interleaved equalized samples to determine appropriate sets of coefficients for the interleaving equalizer. In various embodiments, the calibration input signal is a single frequency at one or more amplitudes, a series of frequencies at one or more amplitudes, a combination of frequencies at one or more amplitudes, or any other appropriate calibration signal. In some embodiments, least squares methods are used to determine appropriate sets of coefficients for the interleaving digitizer. In some embodiments, the calibration input signal comprises sine wave signals of different frequencies that cover the analog bandwidth of the input analog signal. In some embodiments, there are as many sine wave signals (for example 10 or more) as needed to provide the stimulus necessary to be able to achieve a measurement of the magnitude frequency response and the group-delay frequency response in the desired bandwidth. More sine wave signals can allow a more accurate approximation of both the magnitude frequency response and the group delay frequency response. In some embodiments, the calibration signal is allowed to change in its phase relation to the amplitude and phase shift measurer in the calibration measurement unit. This enables the measurement of the received waveform at an effectively higher sampling rate due to the composing of samples from multiple waveforms at different phase offsets to build up a waveform to analyze for the calibration measurement.

Figure 2:
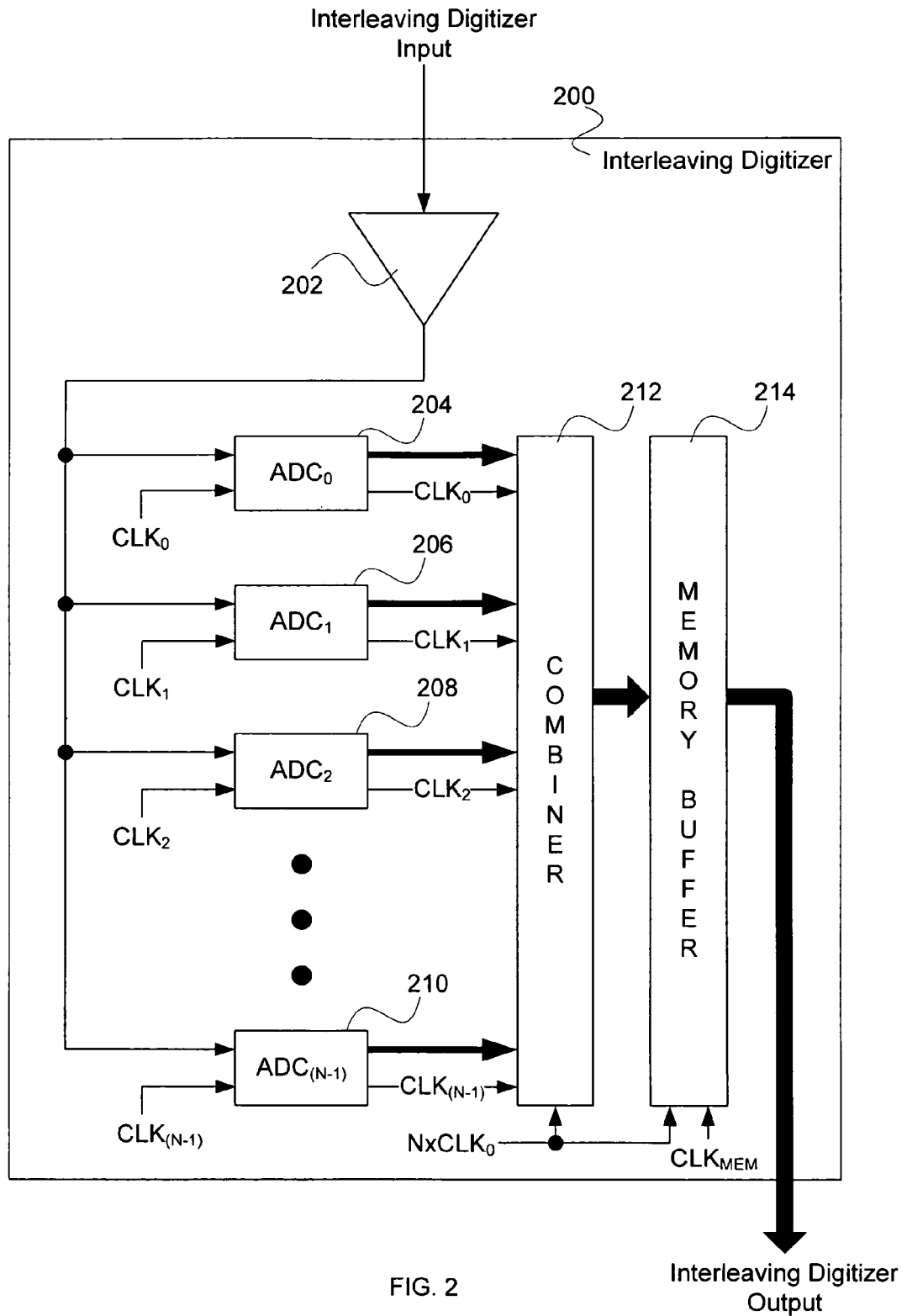
FIG. 2 is a block diagram illustrating an embodiment of an interleaving digitizer.

FIG. 2 is a block diagram illustrating an embodiment of an interleaving digitizer. In some embodiments, interleaving digitizer 200 of FIG. 2 is used to implement interleaving digitizer 104 of FIG. 1. In the example shown, interleaving digitizer 200 is input an analog signal that is input to a buffer amplifier 202. Buffer amplifier 202 sends the input signal to N interleaved analog-to-digital converters (ADC's), represented in FIG. 2 by $ADC_0$ 204, $ADC_1$ 206, $ADC_2$ 208, and $ADC_{(N-1)}$ 210. The interleaved ADC's are clocked by interleaved clocks, represented in FIG. 2 by $CLK_0$, $CLK_1$, $CLK_2$, and $CLK_{(N-1)}$. Interleaved clocks comprise clock signals at the same frequency but shifted in phase. In various embodiments, the clock signals are shifted such that they are equi-spaced in phase, not equi-spaced in phase, or any other appropriate phase spacing. The interleaved clocks are designed to trigger the ADC's such that an effectively higher digitization of the analog input signal to interleaving digitizer 200 is achieved. For example, two ADC's are interleaved 180° offset in phase at the same frequency $f_s$ to achieve an effective sampling of the input signal at $2 \times f_s$.

Combiner 212 combines the outputs of the ADC's in the appropriate order. Combiner 212 receives as inputs the ADC outputs as well as the corresponding CLK's. Combiner 212 also receives a clock at N×CLK or N×$f_s$. Combiner 212 outputs the interleaved samples directly (not shown in FIG. 2) or after buffering in Memory buffer 214. Memory buffer clocks the interleaved samples in at N×CLK or N×$f_s$, and clocks them out at $CLK_{MEM}$, which can be at a higher, lower, or the same frequency compared to N×CLK or N×$f_s$.

Figure 3:
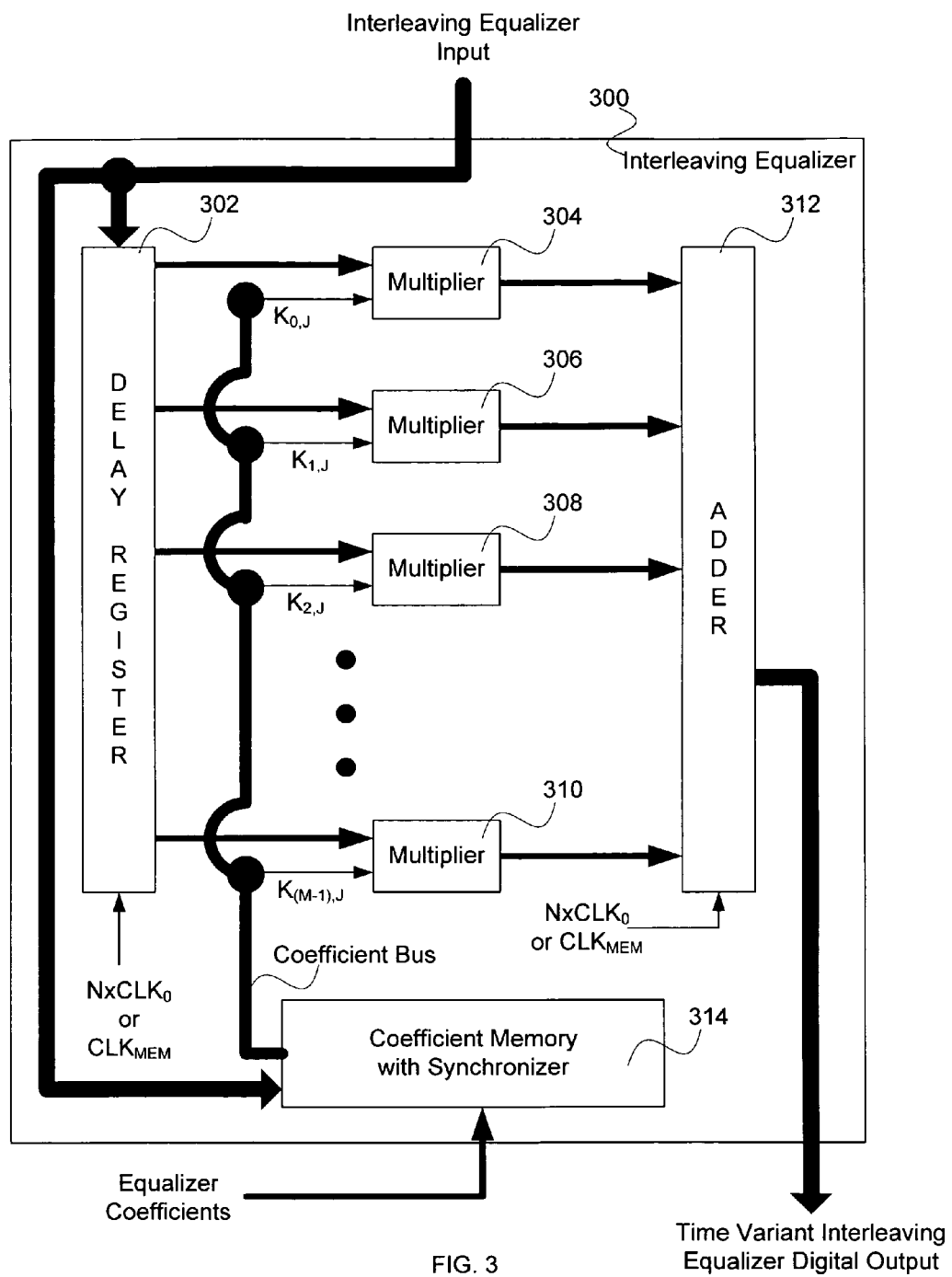
FIG. 3 is a block diagram illustrating an embodiment of an interleaving equalizer.

FIG. 3 is a block diagram illustrating an embodiment of an interleaving equalizer. In some embodiments, interleaving equalizer 300 is used to implement interleaving equalizer 106 of FIG. 1. In the example shown, interleaving equalizer 300 is input interleaved digitized samples and these are clocked into delay register 302 at N×CLK (where CLK is at $f_s$) or $CLK_{MEM}$ depending on the appropriate input clock signal. The subset of samples held in delay register 302 are multiplied using multipliers and sets of equalizer coefficients. The subset of samples held in the delay register a subset of samples are selected to be multiplied by the equalizer coefficients, where a first sample of the subset of samples (e.g., a sample held in a selected spot in the delay register) is associated with a selected digitizer of the plurality of interleaved digitizers. Multipliers are represented in FIG. 3 by multiplier 304, 306, 308, and 310. Equalizer coefficients are represented in FIG. 3 by $K_{0,J}$, $K_{1,J}$, $K_{2,J}$, and $K_{(M-1),J}$, where each J indicates a set of coefficients and there are M coefficients in a set. More taps (e.g., larger M values) can make the equalizer more accurate. Equalizer coefficients are input from a calibration measurement unit and input to coefficient memory and synchronizer 314. Coefficient memory and synchronizer 314 presents the appropriate coefficients to the multipliers using the coefficient bus. In various embodiments, coefficient memory and synchronizer 314 synchronization is enabled by predefined knowledge of the sequence of digitization of the interleaved digitizers or by a signal received (not shown in FIG. 3) indicating the sequence of digitization so that the correct coefficients can be matched with the samples from the appropriate digitizer.

The outputs of the multipliers are summed by adder 312. Adder 312 is clocked at N×CLK (where CLK is at $f_s$) for a real-time output or $CLK_{MEM}$ for a buffered/non-real-time processed output depending on the appropriate input clock signal. The equalizer filter configuration comprises a finite impulse response (FIR) filter. In various embodiments, the filter configuration is an infinite impulse response filter or any other appropriate filter for equalizing the interleaved digitizer samples.

Figure 4:
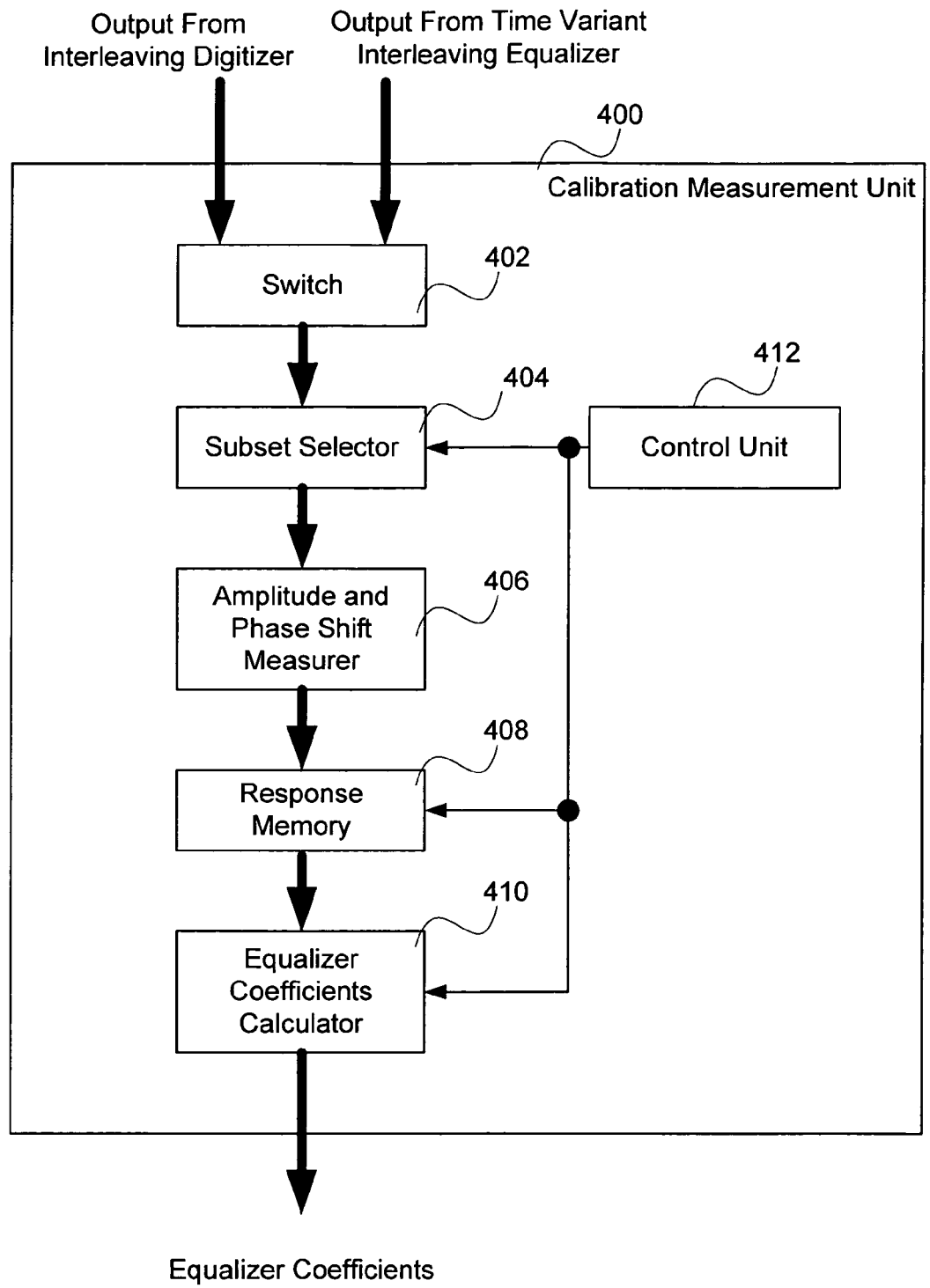
FIG. 4 is a block diagram illustrating an embodiment of a calibration measurement unit.

FIG. 4 is a block diagram illustrating an embodiment of a calibration measurement unit. In some embodiments, calibration measurement unit 400 is used to implement calibration measurement unit 110 of FIG. 1. In the example shown, calibration measurement unit 400 includes switch 402, subset selector 404, amplitude and phase shift measurer 406, response memory 408, equalizer coefficient calculator 410, and control unit 412. The interleaving digitizer output (e.g., output of 104 of FIG. 1) and the time variant interleaving equalizer output (e.g., output of 106 of FIG. 1) are both input to switch 402. Switch 402 is set appropriately to measure the interleaving digitizer output or the time variant interleaving equalizer output. If the equalizer is set properly, then a measurement at the equalizer output of a set calibrated input signals yields a flat amplitude and phase frequency response (e.g., minimal distortions after equalization) or a amplitude and phase response that is the same as a reference amplitude and phase response (e.g., a prestored response or a response from one of the digitizers). A measurement of the output of the digitizing equalizer of a set calibrated input signals yields a response that is indicative of the amplitude and phase frequency response of the components in the signal path. Subset selector 404 can be used to select samples only from one digitizer. In some embodiments, all of the samples are used instead of only a subset of samples. Amplitude and phase shift measurer 406 can be used to measure the amplitude and phase shift of an input waveform, an average of an input wave form, a composed waveform from accumulating samples at different phase offsets, or any other appropriate calibration input waveform. Response memory 406 is used to store the measured responses for the input waveforms at different frequencies, for different digitizing samples, for different synchronization offsets of input samples, or for any other appropriate responses. Equalizer coefficients calculator 410 calculates the different sets of equalizer coefficients based at least in part on the stored responses in response memory 406. In some embodiments, the different sets of equalizer coefficients are calculated by combining appropriately the frequency responses of the different digitizers by weighting the FFT responses for each digitizer, combining, and inverting. In various embodiments, the different sets of equalizer coefficients are calculated by using the frequency responses of a single digitizer's samples or multiple interleaved digitizers' samples. In some embodiments, the different sets of equalizer coefficients are calculated by measuring the phase and amplitude errors at different frequencies for the interleaved digitizer input and inverting a set of responses corresponding to the different synchronizations between the equalizer tap positions and the digitizer samples (e.g., a four digitizer system—a, b, c, and d—with a seven tap equalizer has the synchronizations: a-b-c-d-a-b-c, b-c-d-a-b-c-d, c-d-a-b-c-d-a, and d-a-b-c-d-a-b). Control unit 412 appropriately synchronizes the subset selection, storing in memory, and calculating a given set of equalizer coefficients.

Calibration measurement unit 400 determines the coefficients using the calibration measurement unit output and the interleaved digitized sample output samples (i.e., interleaving equalizer input samples). In some embodiments, the RMS error is minimized between the desired signal and the equalized signal for known calibration input signals (or a stored calibration signal). In some embodiments, calibration measurement unit 400 receives calibration signal generator output as an input (not shown in FIG. 1 or in FIG. 4).

In some embodiments, one set of coefficients of the equalizer is used as a reference. The measurements for the magnitude frequency response and the group-delay frequency response are measured as the difference in the magnitude and the group delay with respect to the reference. The J-1 sets of coefficients of the equalizer are calculated so that the equalizer equalizes the magnitude and group delay responses for the J ADC's (e.g., such that the difference between the reference and the other J-1 sets are reduced to a required level). The set of equalizer coefficients is determined based at least in part on a calibration using a calibrated input signal and using a predetermined set of equalizer coefficients as a reference.

In some embodiments, the first ADC's channel response can be used as a reference channel. The other ADC's channel response measurements for the magnitude and the group delay are expressed as a difference from the first ADC's channel response. The other N-1 ADC channel responses are adjusted using the sets of coefficients for the equalizer so that the channel responses are similar (e.g., so that the responses are reduced to a required level). The set of equalizer coefficients is determined based at least in part on a calibration using a calibrated input signal and using a predetermined digitizer of the plurality of interleaved digitizers as a reference digitizer. Other references for the channel frequency response characteristic can be used as well.

Figure 5:
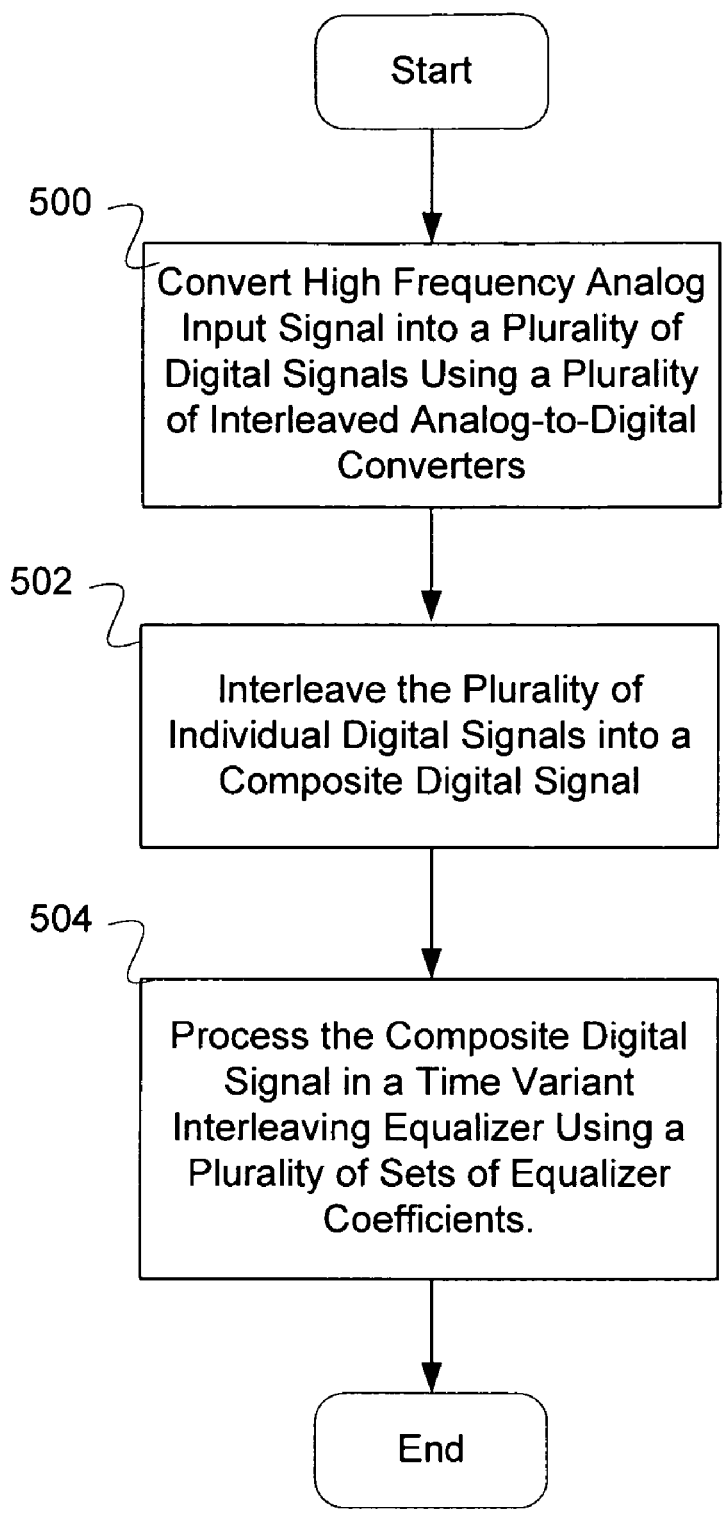
FIG. 5 is a flow diagram illustrating an embodiment of a process for equalizing the signals from an interleaved analog to digital converter using a time variant interleaving equalizer.

FIG. 5 is a flow diagram illustrating an embodiment of a process for equalizing the signals from an interleaved analog to digital converter using a time variant interleaving equalizer. In some embodiments, the process of FIG. 5 is implemented in interleaving equalizer 106 of FIG. 1. In the example shown, in 500 a high-frequency analog input signal is converted into a plurality of individual digital signals using a plurality of interleaved analog-to-digital converters. In some embodiments, the plurality of interleaved analog-to-digital converters are clocked by the same frequency, but offset in phase, so that the interleaved digitizers are enabled to effectively sample the input signal at a higher frequency than the analog-to-digital converter sampling rate. In 502, the plurality of individual digital signals are interleaved into a composite digital signal. And, in 504, the composite digital signal is processed in a time variant interleaving equalizer using a plurality of sets of equalizer coefficients. The time variant interleaving equalizer enables the equalization of the digital data stream despite the interleaving of the data from the plurality of digitizers (each digitizer having its own distortion characteristics).

Figure 6:
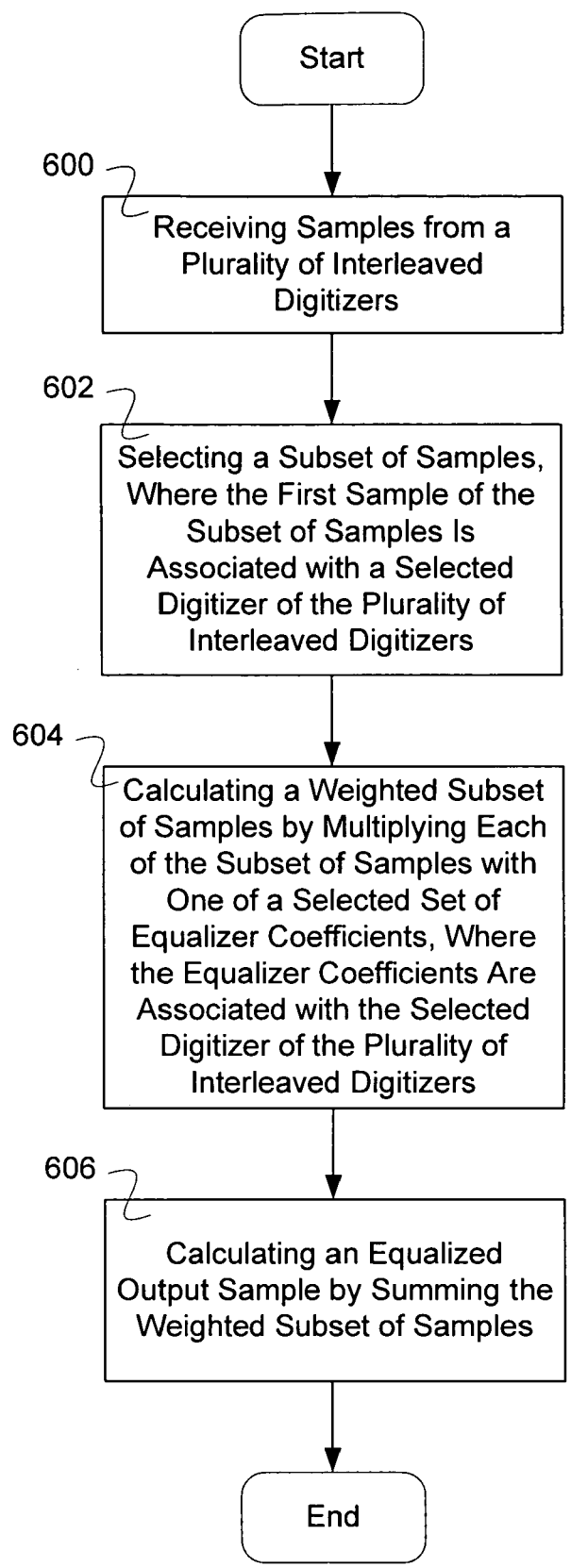
FIG. 6 is a flow diagram illustrating an embodiment of a process for equalizing samples from interleaved digitizers.

FIG. 6 is a flow diagram illustrating an embodiment of a process for equalizing samples from interleaved digitizers. In some embodiments, the process of FIG. 6 is implemented in interleaving equalizer 106 of FIG. 1. In the example shown, in 600 samples are received from a plurality of interleaved digitizers. In 602, a subset of samples are selected where a first sample of the subset of samples is associated with a selected digitizer of the plurality of interleaved digitizers. In some embodiments, the subset of samples corresponds to the samples that are to be entered in the equalizing filter. In 604, a weighted subset of samples is calculated by multiplying each of the subset of samples with one of a selected set of equalizer coefficients corresponding to the selected digitizer of the plurality of interleaved digitizers. In 606, an interleaving equalizer output sample is calculated by summing the weighted subset of samples.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for time variant interleaving equalization of an interleaved analog to digital converter comprising:
   converting a high-frequency analog input signal into a plurality of individual digital signals using a plurality of interleaved analog-to-digital converters;
   interleaving the plurality of individual digital signals into a composite digital signal;
   processing the composite digital signal in a time variant interleaving equalizer using a plurality of sets of equalizer coefficients; wherein the time variant interleaving equalizer is synchronized with the interleaving of the plurality of individual digital signals into the composite digital signal; and
   wherein during any sampling interval, when a certain sample of the composite digital signal is present at the time variant equalizer input, the synchronization of the time variant equalizer assures the identification of the individual digital signal that contained said sample before interleaving.

2. A method for time variant interleaving equalization of an interleaved analog to digital converter comprising:
   converting a high-frequency analog input signal into a plurality of individual digital signals using a plurality of interleaved analog-to-digital converters;
   interleaving the plurality of individual digital signals into a composite digital signal;
   processing the composite digital signal in a time variant interleaving equalizer using a plurality of sets of equalizer coefficients; wherein the time variant interleaving equalizer is synchronized with the interleaving of the plurality of individual digital signals into the composite digital signal; and
   wherein the synchronization of the time variant equalizer assures during a sampling interval the use of one of the plurality of the sets of equalizer coefficients that corresponds to one of the identified individual digital signals.

3. A method for time variant interleaving equalization of an interleaved analog to digital converter comprising:
   converting a high-frequency analog input signal into a plurality of individual digital signals using a plurality of interleaved analog-to-digital converters;
   interleaving the plurality of individual digital signals into a composite digital signal;
   processing the composite digital signal in a time variant interleaving equalizer using a plurality of sets of equalizer coefficients; wherein the time variant interleaving equalizer is synchronized with the interleaving of the plurality of individual digital signals into the composite digital signal; wherein the sets of equalizer coefficients are prepared before the operation of the multiple interleaved analog to digital converter by using a calibration procedure; and
   wherein said calibration procedure comprising the steps of:
   measuring a comparative amplitude and group delay frequency responses of all individual digital signals; and
   calculating the sets of equalizer coefficients based at least in part on the measured comparative amplitude and group delay frequency responses.

4. A method as in claim 3, wherein measurement of the comparative amplitude and group delay frequency responses comprising the steps of:
   generating a sinusoidal analog input signal and feeding the sinusoidal analog input signal to the input of the multiple interleaved analog to digital converter;
   selecting a subset of samples that belong to a certain individual digital signal from the set of samples of the composite digital signal;
   measuring the amplitude and group delay of the selected subset of samples in relation to a reference signal;
   repeating previous steps for each of the individual digital signals; and
   repeating previous steps for different frequencies of the sinusoidal analog input signal, these frequencies covering the entire bandwidth of the multiple interleaved analog to digital converter.

5. A method as in claim 4, wherein one of the individual digital signals is used as the reference signal.

6. A method as in claim 4, wherein an imported amplitude and group delay frequency response is used as the reference.

7. A method as in claim 4, wherein to enhance the accuracy of the equalizer coefficients computation the calibration procedure is repeated with the subset of samples that are chosen from the samples of the digital signal at the time variant equalizer output.

8. A method as in claim 4, wherein the enhancement of the accuracy of the measurement of the comparative amplitude and group delay frequency responses is achieved by using averaging technology wherein a ratio of a calibration frequency signal to a clock signal for the interleaved digitizer differs from an integer by a small deviation.

9. A multiple interleaved analog to digital converter with digital equalization comprising:
   a calibration signal generator, having an output wherein the calibration signal generator is capable of outputting a sinusoidal signal;
   a selection switch, having two signal inputs and an output, wherein the first signal input is connected to a signal that is to be processed by the multiple interleaved analog to digital converter, and wherein the second signal input is connected to the output of the calibration signal generator;
   an anti-aliasing low-pass filter with an input and an output, wherein the input is connected to the output of the selection switch;
   an interleaving digitizer, having an analog input and a digital output, wherein the analog input is connected to the output of the anti-aliasing low-pass filter;
   a time variant equalizer, having a signal input, an equalizer coefficients input and an output, wherein the signal input is connected to the digital output of the interleaving digitizer and the output is used as an output of the multiple interleaved analog to digital converter; and
   a calibration measurement unit, having two inputs and an output, wherein the first input is connected to the digital output of the interleaving digitizer, the second input is connected to the output of the time variant equalizer, and the output of the calibration measurement unit is connected to the equalizer coefficients input of the time variant equalizer.

10. A multiple interleaved analog to digital converter as in claim 9, wherein selection switch switches between the first signal input or the signal from the second signal input depending on whether said digital converter is in an operation mode or in a calibration mode.

11. A multiple interleaved analog to digital converter as in claim 9, wherein the time variant equalizer comprises:
   a delay register with a signal input, a clock input and N outputs, wherein N is a predetermined equalizer length and the signal input of the delay register is used as the time variant equalizer input;
   a set of N multipliers, each multiplier having two inputs and an output, wherein the first input of every multiplier is connected to the corresponding output of the delay register and the second input of every multiplier is connected to an equalizer coefficients bus;
   an adder with N signal inputs, a clock input and an output, wherein each of the signal inputs is connected to the output of the correspondent multiplier and the output is used as an output of the time variant equalizer;
   a coefficient memory with synchronization, having an input and an output equalizer coefficient bus, wherein the input is used as an equalizer coefficient input of the time variant equalizer, and the output equalizer coefficient bus feeds each of the second inputs of each of the N multipliers; and
   a coefficients bus that connects the output of the coefficient memory with synchronization to each of the second inputs of the N multipliers.

12. A multiple interleaved analog to digital converter as in claim 11, wherein the coefficient memory includes synchronization during any sampling interval, wherein when a certain sample of the composite digital signal is present at the time variant equalizer input, the coefficient memory distributes to the equalizer coefficients bus the set of equalizer coefficients corresponding to the individual digital signal that contained said sample before interleaving.

13. A multiple interleaved analog to digital converter with digital equalization as in claim 9, wherein the calibration measurement unit comprises:
   a switch with two inputs and an output, wherein the first input is used as the first input of the calibration measurement unit and the second input is used as the second input of the calibration measurement unit;
   a control unit with an output;
   a subset selector, having a signal input, a control input and an output, wherein the signal input is connected to the output of the switch, and the control input is connected to the output of the control unit;
   a response memory, having a measurement results input, a control input, and an output, wherein the measurement results input is connected to the output of the amplitude and phase shift measurer, and the control input is connected to the output of the control unit; and
   an equalizer coefficients calculator, having a response input, a control input and an output, wherein the response input is connected to the output of the response memory, the control input is connected to the output of the control unit, and the output is used as the output of the calibration measurement unit.

* * * * *